United States Patent
Ryu et al.

(10) Patent No.: US 11,398,531 B2
(45) Date of Patent: Jul. 26, 2022

(54) PLURALITY OF LIGHT CONVERSION LAYERS BETWEEN FIRST AND SECOND SUBSTRATES

(71) Applicant: Samsung Display Co., Ltd., Yongin-Si (KR)

(72) Inventors: Jang Wi Ryu, Seoul (KR); Songyi Kim, Suwon-si (KR); Sujin Kim, Seoul (KR); Woo-Man Ji, Asan-si (KR)

(73) Assignee: Samsung Display Co., Ltd.

( * ) Notice: Subject to any disclaimer, the term of this patent is extended or adjusted under 35 U.S.C. 154(b) by 270 days.

(21) Appl. No.: 16/867,535

(22) Filed: May 5, 2020

(65) Prior Publication Data

US 2020/0381483 A1 Dec. 3, 2020

(30) Foreign Application Priority Data

May 30, 2019 (KR) .......... 10-2019-0063788

(51) Int. Cl.
*H01L 51/00* (2006.01)
*H01L 33/00* (2010.01)
*H01L 31/0232* (2014.01)
*H01L 51/40* (2006.01)
*H01L 27/32* (2006.01)
(Continued)

(52) U.S. Cl.
CPC ...... *H01L 27/322* (2013.01); *H01L 27/14629* (2013.01); *H01L 27/3246* (2013.01); *H01L 51/5246* (2013.01); *H01L 51/5262* (2013.01); *H01L 51/5271* (2013.01); *H01L 51/5284* (2013.01); *H01L 51/56* (2013.01); *G09G 3/3225* (2013.01); *G09G 3/3266* (2013.01); *G09G 3/3275* (2013.01); *H01L 33/50* (2013.01); *H01L 33/60* (2013.01); *H01L 2227/323* (2013.01)

(58) Field of Classification Search
CPC ..... H01L 33/60; H01L 33/50; H01L 27/3211; H01L 27/322; H01L 27/3246; H01L 27/3244; H01L 27/14629; H01L 51/5246; H01L 51/5271; H01L 51/5284; H01L 51/56; H01L 51/5262
See application file for complete search history.

(56) References Cited

U.S. PATENT DOCUMENTS 6,242,326 B1  6/2001  Ro et al.
8,790,958 B2  7/2014  Cho et al.
(Continued)

FOREIGN PATENT DOCUMENTS

CN  104064578 A  *  9/2014  ......... H01L 27/3246
KR  10-0301116 B1  10/2001
(Continued)

*Primary Examiner* — Alonzo Chambliss
(74) *Attorney, Agent, or Firm* — Innovation Counsel LLP

(57) ABSTRACT

Provided is a display device including a first base substrate, a plurality of pixels disposed on the first base substrate and each of which including a pixel area and a non-pixel area around the pixel area, a second base substrate facing the first base substrate with the pixels therebetween, and a plurality of light conversion layers disposed under the second base substrate and overlapping the pixel areas of the pixels, wherein the second base substrate includes a first part overlapping the non-pixel area, and a second part around the first part, wherein a refractive index of the first part is different from a refractive index of the second part.

19 Claims, 10 Drawing Sheets

(51) Int. Cl.
  *H01L 51/52* (2006.01)
  *H01L 51/56* (2006.01)
  *H01L 27/146* (2006.01)
  *G09G 3/3266* (2016.01)
  *G09G 3/3275* (2016.01)
  *G09G 3/3225* (2016.01)
  *H01L 33/60* (2010.01)
  *H01L 33/50* (2010.01)

(56) References Cited

U.S. PATENT DOCUMENTS

| | | | |
|---|---|---|---|
| 9,719,639 B2 | 8/2017 | Gu et al. | |
| 9,837,636 B2 | 12/2017 | Park | |
| 10,114,247 B2 | 10/2018 | Lee | |
| 10,365,509 B2 | 7/2019 | Jeon et al. | |
| 2012/0187394 A1* | 7/2012 | Hatano | H01G 9/2068 257/E31.127 |
| 2015/0097168 A1* | 4/2015 | Hanawa | H01L 51/5271 257/40 |
| 2015/0286097 A1* | 10/2015 | Lee | G02F 1/133617 349/61 |
| 2015/0333108 A1* | 11/2015 | Miyamoto | H01L 51/5275 257/89 |
| 2017/0075215 A1* | 3/2017 | Lee | G02F 1/1368 |
| 2018/0059485 A1 | 3/2018 | Nam et al. | |

FOREIGN PATENT DOCUMENTS

| | | | | |
|---|---|---|---|---|
| KR | 10-1097342 B1 | 12/2011 | | |
| KR | 10-2017-0014755 A | 2/2017 | | |
| KR | 20170080855 A | * 7/2017 | | G02F 1/017 |
| KR | 10-2017-0099026 A | 8/2017 | | |
| KR | 10-2018-0025388 A | 3/2018 | | |
| KR | 10-2018-0081325 A | 7/2018 | | |
| WO | WO-2013073521 A | * 5/2013 | | H01L 27/322 |

* cited by examiner

FIG. 6
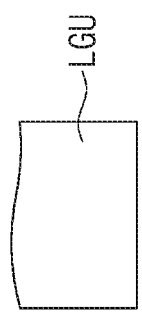
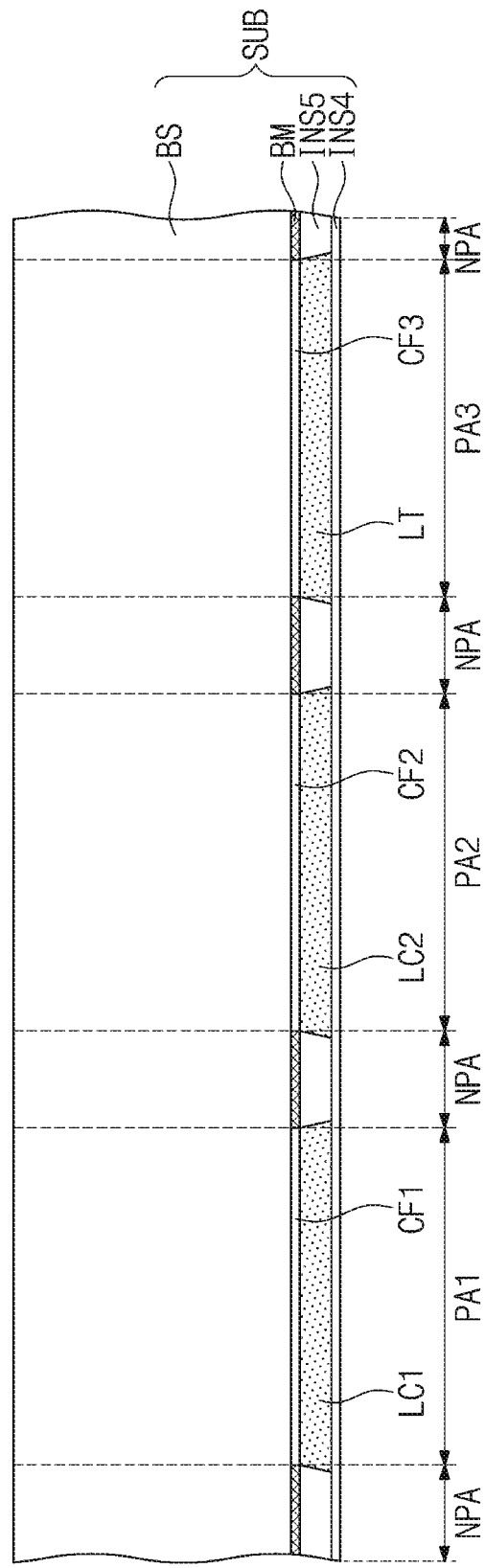

PLURALITY OF LIGHT CONVERSION LAYERS BETWEEN FIRST AND SECOND SUBSTRATES

CROSS-REFERENCE TO RELATED APPLICATIONS

This U.S. non-provisional patent application claims priority under 35 U.S.C. § 119 of Korean Patent Application No. 10-2019-0063788, filed on May 30, 2019, the entire contents of which are hereby incorporated by reference.

BACKGROUND

The present disclosure herein relates to a display device and a manufacturing method thereof, and more particularly, to a display device for improving light extraction efficiency and a manufacturing method thereof.

A display device typically includes a plurality of pixels for displaying an image. Each pixel includes an image display element disposed in a pixel area and a driving element disposed in a non-pixel area around the pixel area. The driving element drives the image display element, the image display device generates prescribed light, and thus an image may be displayed.

Recently, a display device is being developed which includes light conversion layers in order to improve the color purity. The light conversion layers are disposed on pixels, and convert light generated in the pixels into light having different wavelengths. Each of the light conversion layers is disposed to overlap a corresponding pixel among the pixels. The light conversion layers include quantum dots for converting a wavelength of light. The light generated from the light conversion layers are extracted to the outside through a base substrate disposed on the light conversion layers.

SUMMARY

The present disclosure provides a display device for improving light extraction efficiency and a manufacturing method thereof.

An example embodiment of the present disclosure provides a display device including a first base substrate, a plurality of pixels disposed on the first base substrate and each of which including a pixel area and a non-pixel area around the pixel area, a second base substrate facing the first base substrate with the pixels therebetween, and a plurality of light conversion layers disposed under the second base substrate and overlapping the pixel areas of the pixels, wherein the second base substrate includes a first part overlapping the non-pixel area; and a second part around the first part, wherein a refractive index of the first part is different from a refractive index of the second part.

In an embodiment, the first part may be disposed between a top surface and a bottom surface of the second base substrate.

In an embodiment, the first part may be more adjacent to the bottom surface of the second base substrate than the top surface of the second base substrate.

In an embodiment, the display device may further include a black matrix disposed under the second base substrate and overlapping the non-pixel area, wherein the first part is adjacent to the black matrix.

In an embodiment, the display device may further include a partition wall insulation layer disposed between the light conversion layers; and a plurality of color filters disposed between the light conversion layers and the second base substrate, wherein the black matrix is disposed between the color filters.

In an embodiment, a width of the first part may be equal to or smaller than that of the black matrix on the basis of a direction horizontal to the top surface of the second base substrate.

In an embodiment, a thickness of the first part may be equal to or greater than $1/20$ of a thickness of the second base substrate, and equal to or smaller than $1/2$ of the thickness of the second base substrate on the basis of an upward direction vertical to the top surface of the second base substrate.

In an example embodiment of the present disclosure, a manufacturing method of a display device includes: preparing a substrate including a base substrate, a plurality of light conversion layers disposed under the base substrate, and a black matrix disposed under the base substrate and disposed between the light conversion layers, when viewed on a plane; providing laser light to a part of the base substrate, which overlaps the black matrix, to form a first part of the first base substrate; and bonding the substrate to a first substrate including a plurality of pixels, wherein a refractive index of the first part is different from a refractive index of a second part defined as the part of the base substrate around the first part.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 6, 7, 8, 9, and 10 are drawings for explaining a method for manufacturing a display device according to an embodiment of the inventive concept.

DETAILED DESCRIPTION

Figure 1:
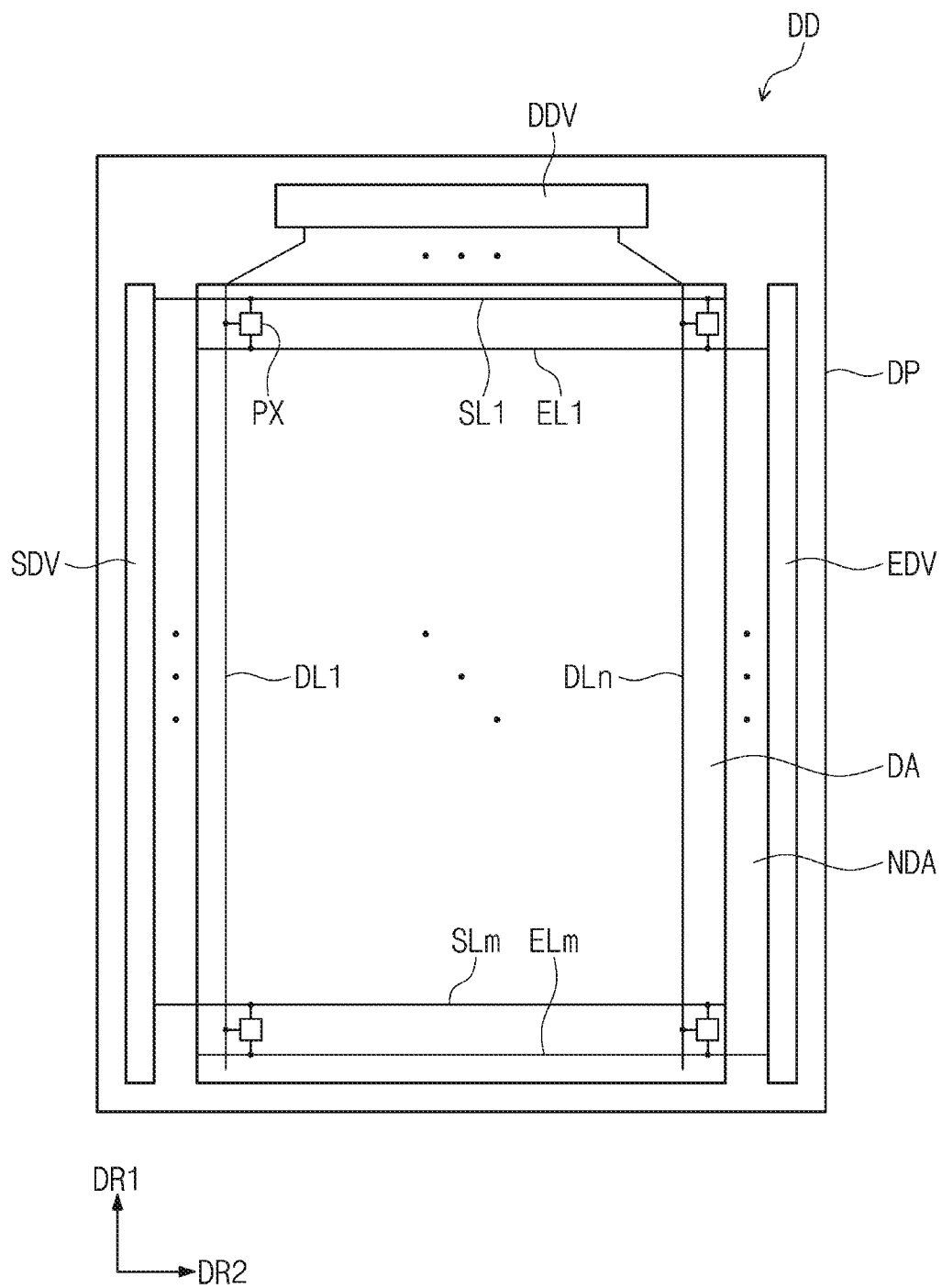
FIG. 1 is a plan view of a display device according to an example embodiment of the present disclosure.

It will be understood that when an element or layer is referred to as being "on", "connected to" or "coupled to" another element or layer, it can be directly on, connected or coupled to the other element or intervening third elements may be present.

Like reference numerals in the drawings refer to like elements. In addition, in the drawings, the thickness and the ratio and the dimension of the element are exaggerated for effective description of the technical contents.

The term "and/or" includes any and all combinations of one or more of the associated items.

Terms such as first, second, and the like may be used to describe various components, but these components should not be limited by the terms. The terms are used only for the purpose of distinguishing one component from another component. For instance, a first component may be referred to as a second component, or similarly, a second component may be referred to as a first component, without departing from the scope of the present disclosure. The singular forms "a," "an" and "the" are intended to include the plural forms as well, unless the context clearly indicates otherwise.

In addition, the terms such as "under", "lower", "on", and "upper" are used for explaining associations of items illustrated in the drawings. It will be understood that the spatially relative terms are intended to encompass different orientations of the device in use or operation in addition to the orientation depicted in the figures.

Unless otherwise defined, all terms (including technical and scientific terms) used herein have the same meaning as commonly understood by one of ordinary skill in the art to which example embodiments belong. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, components or combinations thereof, but do not preclude the presence or addition of one or more other features, integers, steps, operations, elements, components, or combinations thereof.

Hereinafter, embodiments of the present invention will be described in detail with reference to the accompanying drawings.

FIG. 1 is a plan view of a display device according to an example embodiment of the present disclosure.

With reference to FIG. 1, a display device DD according to an example embodiment of the present disclosure may include a display panel DP, a scan driver SDV, a data driver DDV, and an emission driver EDV.

The display panel DP according to an example embodiment of the present disclosure may be an emissive display panel, but is not particularly limited thereto. For example, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot, a quantum rod, or the like. Hereinafter, the display panel DP will be described as an organic light emitting display panel.

The display panel DP may have a rectangular shape with long sides in the first direction DR1 and short sides in the second direction DR2. The display panel DP may include a display area DA and a non-display area NDA surrounding the display area DA.

The display panel DP may include a plurality of pixels PX, a plurality of scan lines SL1 to SLm, a plurality of data lines DL1 to DLn, and a plurality of emission lines EL1 to ELm. Here, m and n are respectively natural numbers. The pixels PX may be disposed on the display area DA, and connected to the scan lines SL1 to SLm, the data lines DL1 to DLn, and the emission lines EL1 to ELm.

The scan driver SDV, the data driver DDV, and the emission driver EDV may be disposed on the non-display area. The scan driver SDV and the emission driver EDV may be respectively disposed adjacent to long sides of the display panel DP.

The data driver DDV may be manufactured in an integrated circuit chip type to be disposed adjacent to any one short side among the short sides of the display panel DP. However, the example embodiment of the present disclosure is not limited thereto, and the data driver DDV may be mounted on a flexible circuit board (not shown), and the flexible circuit board may be connected to the display panel DP. The data driving unit DDV may be connected to the display panel DP through the flexible circuit board.

The scan lines SL1 to SLm may be extended in the second direction DR2 to be connected to the scan driver SDV. The data lines DL1 to DLn may be extended in the first direction DR1 to be connected to the data driver DDV. The emission lines EL1 to ELm may be extended in the second direction DR2 to be connected to the emission driver EDV.

The scan driver SDV may generate a plurality of scan signals, and the scan signals may be applied to the pixels PX through the scan lines SL1 to SLm. The scan signals may be sequentially applied to the pixels PX. The data driver DDV may generate a plurality of data voltages, and the data voltages may be applied to the pixels PX through the data lines DL1 to DLn. The emission driver EDV may generate a plurality of emission signals and the emission signals may be applied to the pixels PX through the emission lines EL1 to ELm.

Although not shown in the drawing, the display device DD may include a timing controller (not shown) for controlling operations of the scan driver SDV, the data driver DDV, and the emission driver EDV.

The timing controller may generate a scan control signal, a data control signal, and an emission control signal in response to control signals received from the outside. The timing controller may receive image signals from the outside and provide the converted signals to the data driver DDV after converting the data format of the image signals to be matched with the specification of an interface with the data driver DDV.

The scan driver SDV may generate the scan signals in response to the scan control signal, and the emission driver EDV may generate the emission signals in response to the emission control signal. The data driver DDV may receive the image signals of which data format is converted, and generate data voltages corresponding to the image signals in response to the data control signal.

The pixels PX may receive data voltages in response to the scan signals. The pixels PX may display an image by emitting light having the brightness corresponding to the data voltages in response to the emission signals. Emission times of the pixels PX may be controlled by the emission signals.

Figure 2:
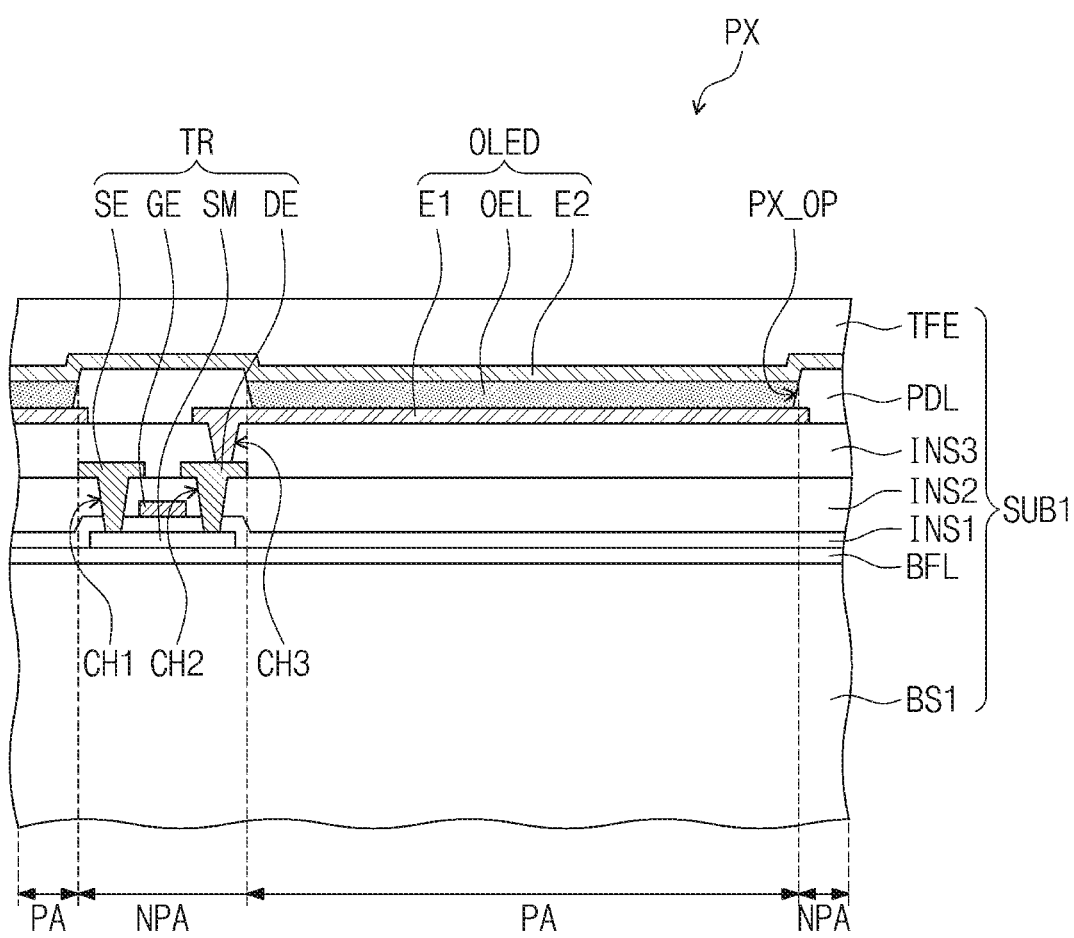
FIG. 2 schematically illustrates a cross-sectional configuration of any one pixel shown in FIG. 1.

FIG. 2 schematically illustrates a cross-sectional configuration of any one pixel shown in FIG. 1.

With reference to FIG. 2, the display panel DP may include a first substrate SUB1, and the first substrate SUB1 may include a pixel PX. The pixel PX may include a light emitting element OLED and a transistor TR connected thereto. The light emitting element OLED may be an organic light emitting element. The light emitting element OLED may include a first electrode E1, a second electrode E2, and an organic emission layer OEL disposed between the first electrode E1 and the second electrode E2.

The first electrode E1 may be an anode, and the second electrode E2 may be a cathode. The first electrode E1 may be defined as a pixel electrode, and the second electrode E2 may be defined as a common electrode.

The pixel PX may be divided into a pixel area PA and a non-pixel area NPA surrounding the pixel area PA. The light emitting element OLED may be disposed in the pixel area PA, and the transistor TR may be disposed in the non-pixel area NPA.

The first substrate SUB1 may include a first base substrate BS1, a buffer layer BFL, first, second and third insulation layers INS1, INS2 and INS3, a pixel definition layer PDL, and a thin film encapsulation layer TFE. The first base substrate BS1 may be a transparent insulation substrate including glass or plastics.

The transistor TR and the light emitting element OLED may be disposed on the first base substrate BS1. A buffer layer BFL may be disposed on the first base substrate BS1 and may include an inorganic material.

A semiconductor layer SM of the transistor TR may be disposed on the buffer layer BFL. The semiconductor layer SM may include a semiconductor of an inorganic material such as amorphous silicon or polysilicon, or an organic semiconductor. In addition, the semiconductor layer SM may include an oxide semiconductor. Although not shown in FIG. 2, the semiconductor layer SM may include a source region, a drain region, and a channel region between the source region and the drain region.

The first insulation layer INS1 may be disposed on the buffer layer BFL so as to cover the semiconductor layer SM. The first insulation layer INS1 may include an inorganic material. A gate electrode GE of the transistor TR, which overlaps the semiconductor layer SM, may be disposed on the first insulation layer INS1. The gate electrode GE may be disposed to overlap the channel region of the semiconductor layer SM.

The second insulation layer INS2 may be disposed on the first insulation layer INS1 so as to cover the gate electrode GE. The second insulation layer INS2 may include an organic material and/or inorganic material.

A source electrode SE and a drain electrode DE of the transistor TR may be separately disposed on the second insulation layer INS2. The source electrode SE may be connected to the source region of the semiconductor layer SM through a first contact hole CH1 defined in the first insulation layer INS1 and the second insulation layer INS2. The drain electrode DE may be connected to the drain region of the semiconductor layer SM through a second contact hole CH2 defined in the first insulation layer INS1 and the second insulation layer INS2.

The third insulation layer INS3 may be disposed on the second insulation layer INS2 so as to cover the source electrode SE and the drain electrode DE of the transistor TR. The third insulation layer INS3 may be defined as a planarization layer for providing a flat top surface and may include an organic material.

A first electrode E1 may be disposed on the third insulation layer INS3. The first electrode E1 may be connected to the drain electrode DE of the transistor TR through a third contact hole CH3 defined in the third insulation layer INS3.

The pixel definition layer PDL for exposing a prescribed portion of the first electrode E1 may be disposed on the first electrode E1 and the third insulation layer INS3. In the pixel definition layer PDL, an opening part PX_OP may be defined to expose the prescribed portion of the first electrode E1.

The organic electrode layer OEL may be disposed on the first electrode E1 in the opening part PX_OP. Each of the organic emission layers OEL may include a small molecule organic material or a polymer organic material. In an embodiment of the inventive concept, the organic emission layer OEL may generate first light having a blue color.

A second electrode E2 may be disposed on the pixel definition layer PDL and the organic emission layer OEL. The thin film encapsulation layer TFE may be disposed on the second electrode E2 so as to cover the light emitting element OLED.

A first voltage may be applied to the first electrode E1, and a second voltage having a lower level than the first voltage may be applied to the second electrode E2. A hole and an electron injected to the organic emission layer OEL may be combined to form an exciton, and the light emitting element OLED may emit light while the exciton is transitioned to the ground state.

Figure 3:
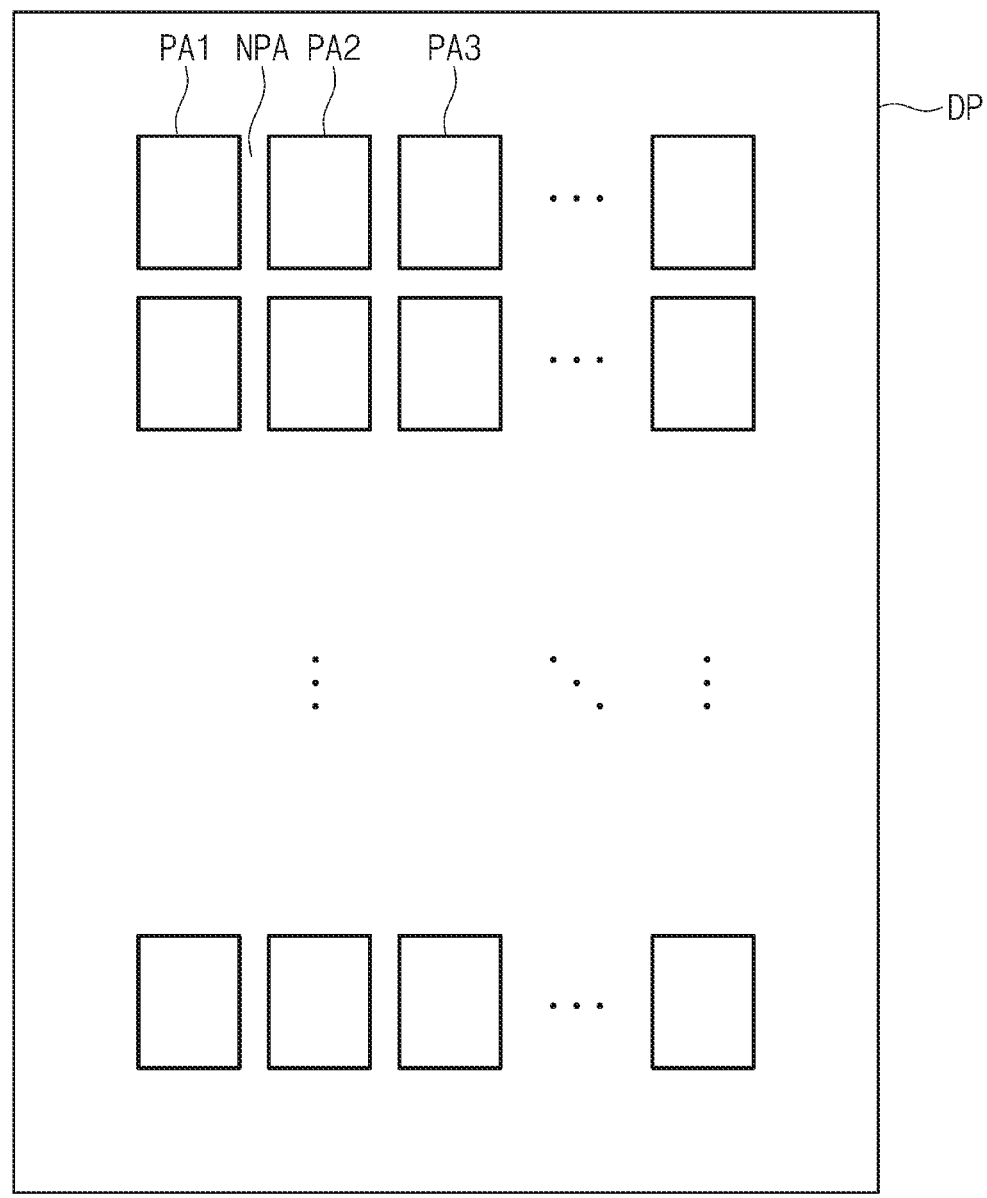
FIG. 3 is a top plan view of a display panel in which a pixel area and a non-pixel area shown in FIG. 2 are displayed on the display panel shown in FIG. 1.

FIG. 3 is a top plan view of a display panel in which the pixel area and the non-pixel area shown in FIG. 2 are displayed on the display panel shown in FIG. 1.

With reference to FIG. 3, the display panel DP may include a plurality of pixel areas PA1, PA2 and PA3, and a non-pixel area NPA surrounding the pixel areas PA1, PA2 and PA3. The non-pixel area NPA may be defined as an area between pixel areas PA1, PA2, and PA3. The pixel area PA shown in FIG. 2 may be any one among the pixel areas PA1, PA2 and PA3 shown in FIG. 3.

The pixel areas PA1, PA2, PA3 may be arrayed in a matrix type. However, the example embodiment of the present disclosure is not limited thereto and the pixel areas PA1, PA2, PA3 may be arrayed in various types. Each of the pixel areas PA1, PA2, and PA3 may have a rectangular shape with short sides in the first direction DR1 and long sides in the second direction DR2. However, the example embodiment is not limited thereto, and the pixel areas PA1, PA2 and PA3 may have various shapes.

The pixel areas PA1, PA2 and PA3 may include a plurality of first pixel areas PA1, a plurality of second pixel areas PA2, and a plurality of third pixel areas PA3. The first, second and third pixel areas PA1, PA2 and PA3 may be sequentially arrayed in the first direction DR1.

Figure 4:
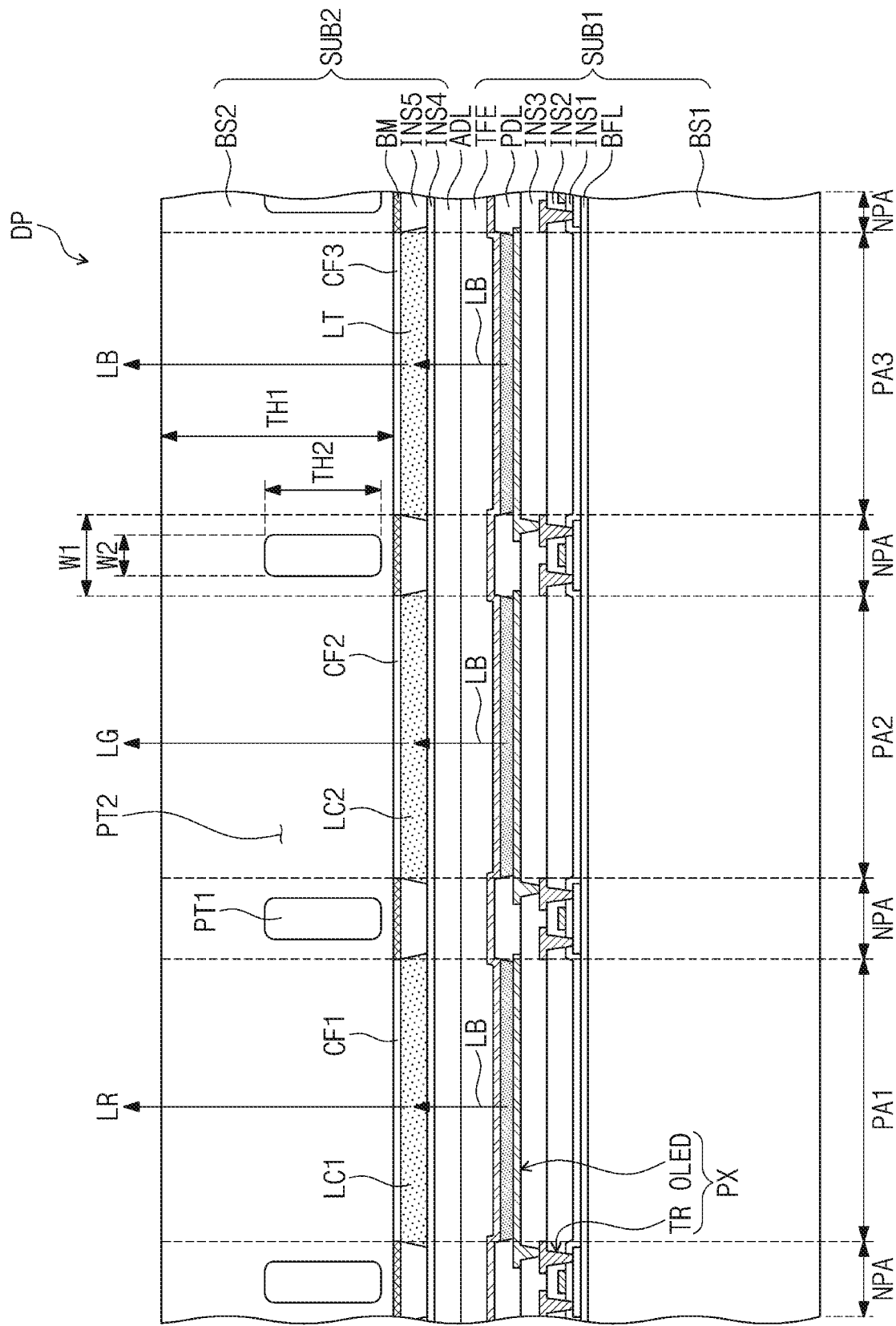
FIG. 4 is a cross-sectional view of a display panel in which first, second, and third pixel areas shown in FIG. 3 are disposed thereon.

FIG. 4 is a cross-sectional view of a display panel in which the first, second, and third pixel areas shown in FIG. 3 are disposed thereon.

For convenience of explanation, FIG. 4 illustrates a cross section of the display panel DP on which the first pixel area PA1, the second pixel area PA2 and the third pixel area PA3, which are adjacent to each other, are disposed.

With reference to FIG. 4, the display panel DP may include a first substrate SUB1 including a plurality of pixels, a second substrate SUB2 disposed on the first substrate SUB1, and an adhesive ADL disposed between the first substrate SUB1 and the second substrate SUB2. The second substrate SUB2 may face the first substrate SUB1 and be bonded to the first substrate SUB1 by means of the adhesive ADL.

The second substrate SUB2 may include a second base substrate BS2, a plurality of light conversion layers LC1, LC2, and LT, a plurality of color filters CF1, CF2 and CF3, a black matrix BM, a fourth insulation layer INS4 and a fifth insulation layer INS5.

The second base substrate BS2 may be a transparent insulation substrate including glass or plastics. The second base substrate BS2 may face the first base substrate BS1 with the pixels PX therebetween.

The light conversion layers LC1, LC2, and LT, the color filters CF1, CF2 and CF3, the black matrix BM, the fourth insulation layer INS4 and the fifth insulation layer INS5 may be disposed under the second base substrate BS2. Accordingly, the light conversion layers LC1, LC2, and LT, the color filters CF1, CF2 and CF3, the black matrix BM, the fourth insulation layer INS4 and the fifth insulation layer INS5 may be disposed between the first base substrate BS1 and the second base substrate BS2.

The adhesive ADL is disposed on the thin film encapsulation layer TFE, and the fourth insulation layer INS4 may be disposed on the adhesive ADL. The fourth insulation layer INS4 may include an inorganic material.

Hereinafter, expressions of "overlapping the pixel areas PA1, PA2 and PA2" and "overlapping the non-pixel area NPA" may mean configurations overlapping the pixel areas PA1, PA2 and PA3, and configurations overlapping the non-pixel area NPA, when viewed on a plane.

The light conversion layers LC1, LC2, and LT may be disposed on the fourth insulation layer INS4. The light conversion layers LC1, LC2 and LT may respectively overlap the first, second and third pixel areas PA1, PA2 and PA3. A fifth insulation layer INS5 may be disposed on the fourth insulation layer INS4. The fifth insulation layer INS5 may overlap the non-pixel area NPA to be disposed between the light conversion layers LC1, LC2, and LT. The fifth insulation layer INS5 may be defined as a partition wall insulation layer.

The light conversion layers LC1, LC2, and LT may include a first light conversion layer LC1 overlapping the first pixel area PA1, a second light conversion layer LC2 overlapping the second pixel area PA2, and a light transmission layer LT overlapping the third pixel area PA3. The first light conversion layer LC1 may include first quantum dots (not shown), and the second light conversion layer LC2 may include second quantum dots (not shown). The light transmission layer LT may include light scattering particles (not shown).

The first quantum dots may convert light in a blue wavelength band into light in a red wavelength band. The second quantum dots may convert light in a blue wavelength band into light in a green wavelength band. The first and second quantum dots may scatter the light. The light transmission light LT may scatter the light through the light scattering particles without performing the light conversion operation.

The color filters CF1, CF2, and CF3 may overlap the first, second, and third pixel areas PA1, PA2 and PA3 to be respectively disposed on the light conversion layers LC1, LC2, and LT. The color filters CF1, CF2 and CF3 may be disposed between the second base substrate BS2 and the light conversion layers LC1, LC2 and LT. The color filters CF1, CF2 and CF3 may include the first color filter CF1 disposed on the first light conversion layer LC1, the second color filter CF2 disposed on the second light conversion layer LC2, and a third color filter CF3 disposed on the light transmission layer LT.

The first color filter CF1 includes a red color filter, the second color filter CF2 includes a green color filter, and the third color filter CF3 may include a blue color filter. However, the example embodiment of the present disclosure is not limited thereto, and the third color filter CF3 may include a transparent color filter. In addition, the light transmission layer LT and the third color filter CF3 may be integrally formed.

The black matrix BM may overlap the non-pixel area NPA to be disposed between the first CF1, second CF2, and third CF3 color filters. Accordingly, when viewed from a plane, the black matrix BM may be disposed between the light conversion layers LC1, LC2 and LT. The black matrix BM may be disposed on the fifth insulation layer INS5. The black matrix BM may absorb and block the light.

The second base substrate BS2 may include a first part PT1 overlapping the non-pixel area NPA and a second part PT2 around the first part PT1. A refractive index of the first part PT1 may be different from that of the second part PT2. The first part PT1 may be defined as a light guiding pattern for guiding a traveling direction of the light. The first part PT1 may be formed in such a way that a prescribed part of the second base substrate BS2, which overlaps the non-pixel area NPA, is modified by means of laser light, and this manufacturing method will be described in detail below.

The first part PT1 may be disposed between the top surface of the second base substrate BS2 and the bottom surface of the second base substrate BS2. The first part PT1 may be located closer to the bottom surface of the second base substrate BS2 than to the top surface of the second base substrate BS2.

The bottom surface of the second base substrate BS2 may be one surface of the second base substrate BS2 that faces the first substrate SUB1, and the top surface of the second base substrate BS2 may be an opposite surface of the bottom surface of the second base substrate BS2. The top and bottom surfaces of the second base substrate BS2 may substantially have planes defined by first and second directions DR1 and DR2.

The first part PT1 may overlap the black matrix BM to be adjacent thereto. A cross-sectional view of the first part PT1 may have a rectangular shape with curved vertices. However, the example embodiment of the present disclosure is not limited thereto, and the cross section of the first part PT1 may have various shapes including a polygonal shape with curved vertices, or an elliptical shape elongated up and down.

The black matrix BM may have a first width W1, and the first part may have a second width W2 on the basis of a direction (e.g., the first direction DR1 or the second direction DR2) horizontal to the plane of the second base substrate BS2. The plane of the second base substrate BS2 may indicate the top surface or the bottom surface of the second base substrate BS2.

The second width W2 may be smaller than or equal to the first width W1. For example, as illustrated in FIG. 4, the second width W2 may be smaller than the first width W1. However, the example embodiment of the present disclosure is not limited thereto, and the second width W2 may be equal to the first width W1.

The second base substrate BS2 may have a first thickness TH1 on the basis of the upward direction vertical to the plane of the second substrate BS2. The first thickness TH1 of the second base substrate BS2 may be defined as the distance between the top surface and the bottom surface of the second base substrate BS2 on the basis of the upward direction.

The first part PT1 may have a second thickness TH2 on the basis of the upward direction. The second thickness TH2 of the first part PT1 may be defined as the distance between the top surface and the bottom surface of the first part PT1 on the basis of the upward direction. The second thickness TH2 may be larger than or equal to $\frac{1}{20}$ of the first thickness TH1, and smaller than or equal to $\frac{1}{2}$ of the first thickness TH1.

The light emitting elements OLED of the first, second, and third pixel areas PA1, PA2 and PA3 may generate first light LB having a blue color. The first light LB generated by the light emitting element OLED in the first pixel area PA1 may be provided to the first light conversion layer LC1. The first light LB generated by the light emitting element OLED in the second pixel area PA2 may be provided to the second light conversion layer LC2. The first light LB generated by the light emitting element OLED in the third pixel area PA3 may be provided to the light transmission layer LT.

The first quantum dots of the first light conversion layer LC1 may convert the first light LB into second light LR. For example, the first quantum dots may convert a blue color wavelength of the first light LB into a red color wavelength to generate the second light LR having the red color wavelength. The second light LR may be extracted in the upward direction through the first color filter CF1.

A part of the first light LB may penetrate through the first light conversion layer LC1 without contacting the first quantum dots, and then be provided to the first color filter CF1. In other words, the first light LB, which does not contact the first quantum dots and is not converted into the second light LR, may be present. The first light LB, which has not been converted in the first light conversion layer LC1, may be converted into the second light LR having the red color in the first color filter CF1 and extracted in the upward direction.

The second quantum dots of the second light conversion layer LC2 may convert the first light LB into third light LG. For example, the second quantum dots of the second light conversion layer LC2 may convert the blue color wavelength of the first light LB into a green color wavelength to generate the third light LC having the green color wavelength. The third light LG may be extracted in the upward direction through the second color filter CF2.

A part of the first light LB penetrates through the second light conversion layer LC2 without contacting the second quantum dots, and then be provided to the second color filter CF2. In other words, the first light LB, which does not contact the first quantum dots and is not converted into the third light LG, may be present. The first light LB, which has not been converted in the second light conversion layer LC2, may be converted into the third light LG having the green color in the second color filter CF2 and extracted in the upward direction.

The first light LB provided to the light transmission layer LT may be extracted in the upward direction through the light transmission layer LT and the third color filter CF3. Accordingly, the red, green, blue color light may be extracted through the display panel DP to cause an image to be displayed. The black matrix BM may block light that is not necessary in the non-pixel area NPA.

The first, second, and third color filters CF1, CF2, and CF3 may convert external light into red, green, and blue color light. For example, external light provided to the second base substrate BS2 from above the second base substrate BS2 may be converted into the red, green, and blue color light through the first, second and third color filters CF1, CF2 and CF3. Accordingly, identically to the light conversion layers LC1, LC2 and LT, the red, green, and blue color light may be displayed through the first, second, and third color filters CF1, CF2, and CF3, even when the external light is provided to the display panel DP.

Figure 5:
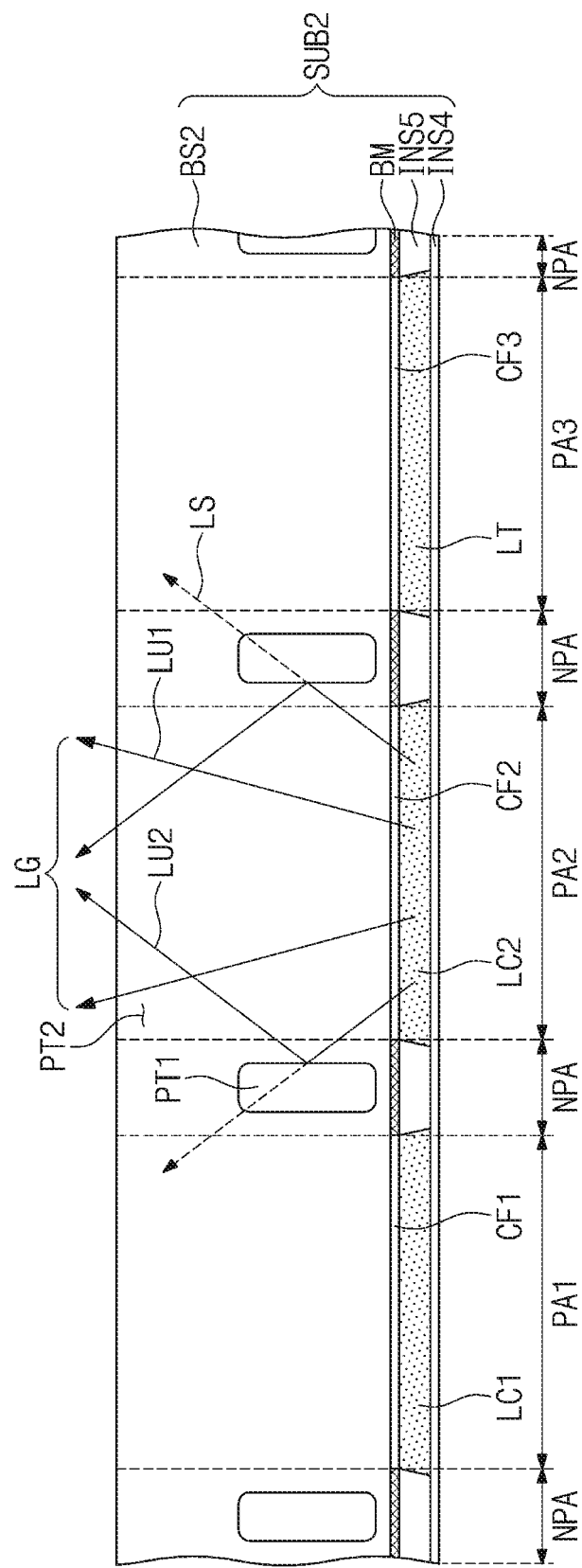
FIG. 5 is a drawing in which light extracted from a second substrate shown in FIG. 4 is specifically illustrated.

FIG. 5 is specifically illustrating light extracted from the second substrate shown in FIG. 4.

Although the traveling direction of the third light LG extracted from the second light conversion layer LC2 is illustrated as an example, the first light LB and the second light LR, which are output from the other light conversion layers LC1 and LT, may also travel similarly as the third light LG. For convenience of explanation, side light LS is illustrated with dotted arrows, and the first upward light LU1 and the second upward light LU2 are illustrated with solid arrows.

With reference to FIG. 5, the third light LG generated in the second light conversion layer LC2 may travel in various directions. For example, the first upward light LU1 of the third light LG may be extracted to the top portion of the second base substrate BS2, which overlaps the second pixel area PA2.

However, when the first part PT1 does not exist, the side light LS of the third light LG may travel to an area of the second base substrate BS2, which overlaps the first and third pixel areas PA1 and PA3. In this case, the light extraction efficiency of a pixel including the second pixel area PA2 may be lowered.

As described above, the refractive index of the first part PT1 and the refractive index of the second part PT2 may be different from each other. In this case, light may be reflected at the boundary surface between the first part PT1 and the second part PT2. For example, a part of light may be reflected at the boundary surface between different materials.

The third light LG, which travels toward the first part PT1, may be reflected at the boundary surface between the first part PT1 and the second part PT2 to be extracted to the top portion of the second base substrate BS2. Accordingly, the light extraction efficiency of the pixel PX including the second pixel area PA2 may be improved. Although the light extraction efficiency of the pixel PX including the second pixel are PA2 is illustrated as an example, the light extraction efficiencies of other pixels PX may be similarly improved.

Consequently, the display device DD according to the example embodiment of the present disclosure may improve light extraction efficiencies of the respective pixels PX by extracting light, which is generated in each of the light conversion layers LC1, LC2, and LT, upward through the first part PT1.

FIGS. 6, 7, 8, 9, and 10 are illustrating a method for manufacturing a display device according to an example embodiment of the present disclosure.

For convenience of explanation, FIGS. 6, 7, 8, 9, and 10 illustrate cross-sectional surfaces corresponding to FIGS. 4 and 5. In addition, the pixel areas PA1, PA2 and PA3 and the non-pixel area NPA are illustrated together with a substrate SUB in FIGS. 6, 7, 8, and 9.

With reference to FIG. 6, the substrate SUB, which includes a base substrate BS, color filters CF1, CF2, and CF3, a black matrix BM, and light conversion layers LC1, LC2 and LT, may be prepared. In the second substrate SUB2 illustrated in FIG. 4, the substrate SUB may be defined as the second substrate SUB2 before the first part PT1 is manufactured.

In order to differentiate from the second substrate SUB2 and the second base substrate BS2 illustrated in FIG. 4, the second substrate SUB2 in FIG. 6 is denoted as a substrate SUB, and the second base substrate BS2 is denoted as a base substrate BS. In addition, in FIGS. 7, 8, and 9, the second substrate SUB2 will be denoted as a substrate SUB, and the second base substrate BS2 will be denoted as a base substrate BS.

A laser light generation unit LGU may be placed above the substrate SUB. The laser light generation unit LGU may generate femtosecond laser light or ultraviolet laser light.

Figure 7:
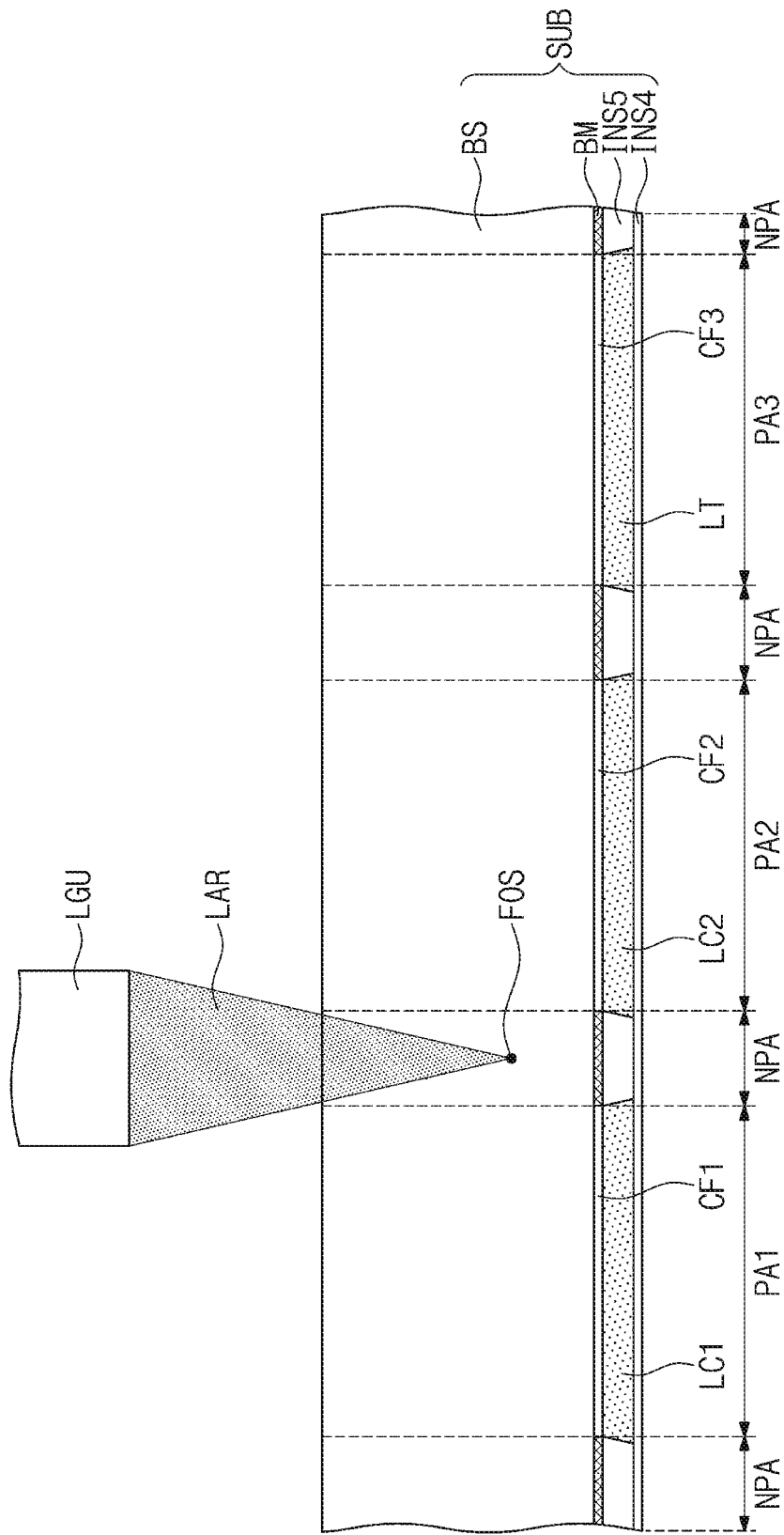

With reference to FIG. 7, the laser light LAR generated by the laser light generation unit LGU may be emitted to the base substrate BS. The focal point FOS of the laser light LAR may be focused inside the base substrate BS on which the first part PT1 is to be made.

Figure 8:
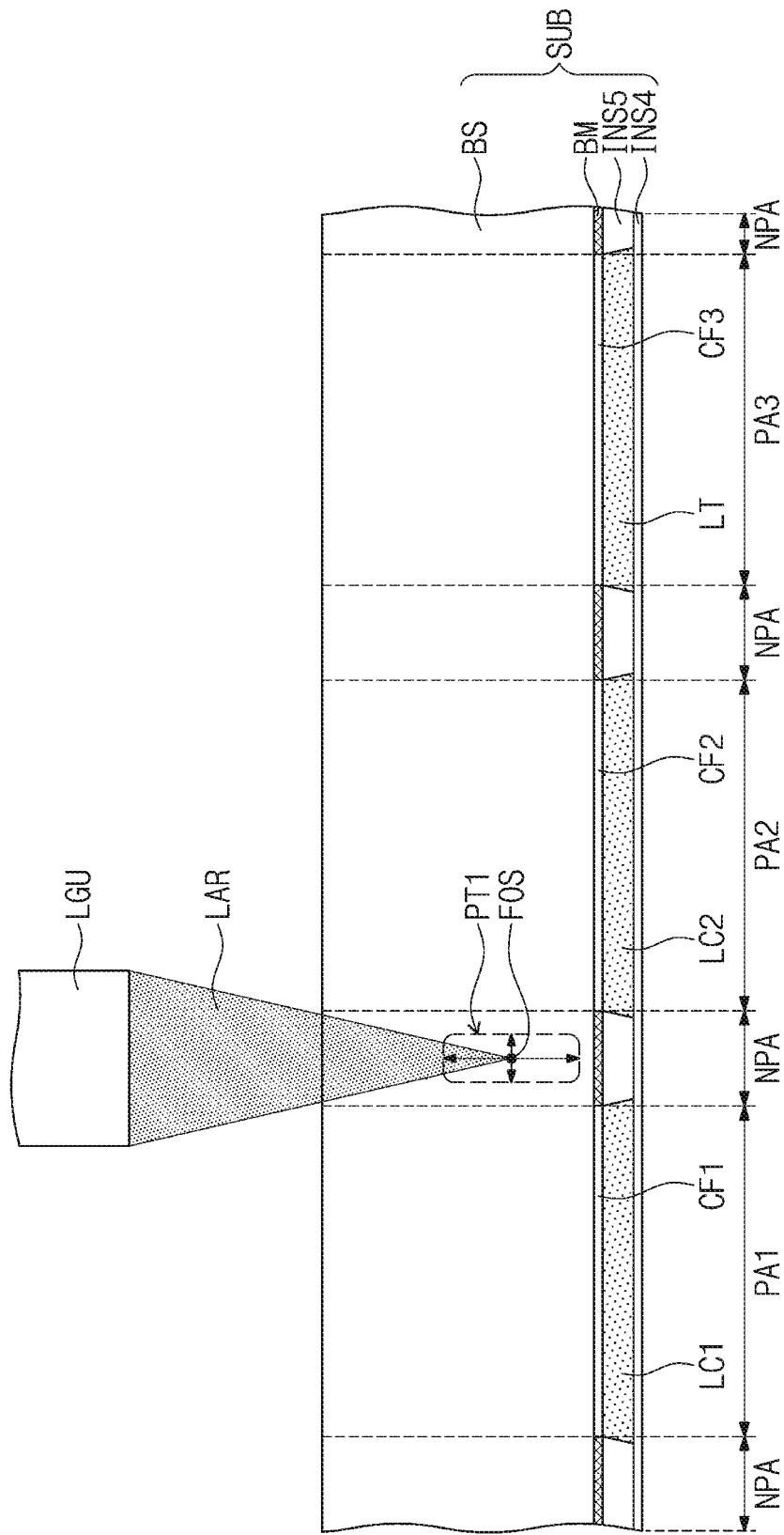
Figure 9:
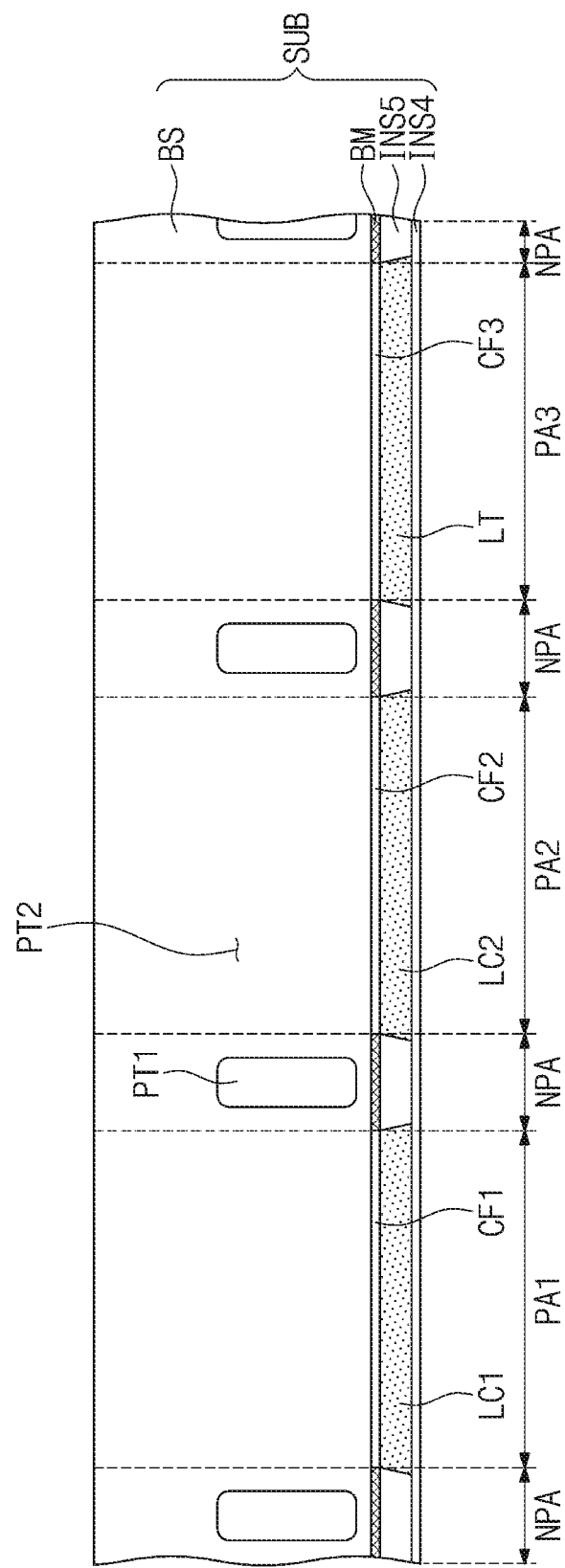

With reference to FIGS. 8 and 9, the focal point FOS of the laser light LAR moves up and down, and left and right, and is emitted to a portion of the base substrate BS on which the first part PT1 is to be made. As a result, the second part PT2 may be defined as a part of the base substrate BS around the first part PT1. In other words, the remaining part of the base substrate BS, in which the first part PT1 is not made, may be the second part PT2.

The characteristics of the first part PT1 of the base substrate BS may be differed, by means of the laser light LAR, from that of the second part PT2 that is the remaining part of the base substrate BS. For example, the refractive index of the first part PT1 may be differed from that of the second part PT2.

Figure 10:
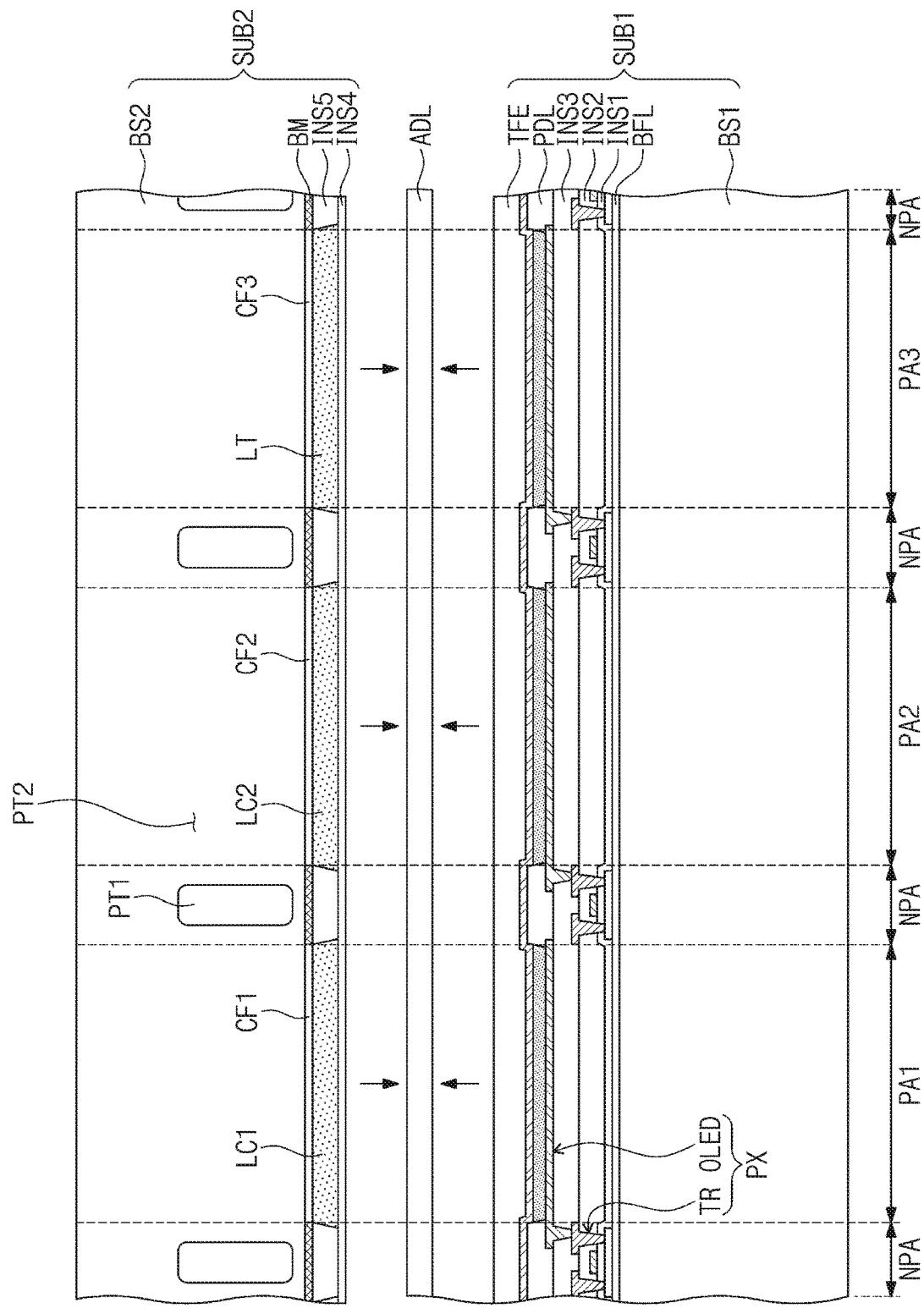

With reference to FIG. 10, the second substrate SUB2 including the first part PT1 may be disposed on the first substrate SUB1. An adhesive ADL may be disposed between the first substrate SUB1 and the second substrate SUB2. The first substrate SUB1 and the second substrate SUB2 may be bonded by means of the adhesive ADL to allow the display device DD to be manufactured.

Accordingly, the display device DD, which includes the second base substrate BS2 on which the first part PT1 is formed, may be manufactured. As a result, light generated by each of the light conversion layers LC1, LC2, and LT may be extracted upward through the first part PT1 to improve the light extraction efficiency of each pixel PX.

According to the example embodiments of the present disclosure, the base substrate disposed on the light conversion layers includes a first part overlapping the non-pixel area, and light generated from each of the light conversion layers is guided and extracted to the top portion by the first part. Accordingly, the light extraction efficiency of each pixel may be improved.

Although the example embodiments of the present embodiment have been described, it is understood that the example embodiment should not be limited to these example embodiments but various changes and modifications can be made by one ordinary skilled in the art within the spirit and scope of the present invention as hereinafter claimed. In addition, embodiments disclosed in the present disclosure are not intended to limit the technical spirit of the inventive concept, and the protection scope of the present embodiment should be interpreted based on the following appended claims and it should be appreciated that all technical spirits included within a range equivalent thereto are included in the protection scope of the present embodiment.

What is claimed is:

1. A display device comprising:
    a first base substrate;
    a plurality of pixels disposed on the first base substrate and each of which including a pixel area and a non-pixel area around the pixel area;
    a second base substrate facing the first base substrate with the pixels therebetween; and
    a plurality of light conversion layers disposed under the second base substrate and overlapping the pixel areas of the pixels,
    wherein the second base substrate comprises:
    a first part overlapping the non-pixel area; and
    a second part around the first part,
    wherein a refractive index of the first part is different from the refractive index of the second part.

2. The display device of claim 1, wherein the first part is disposed between a top surface and a bottom surface of the second base substrate.

3. The display device of claim 2, wherein the first part is located closer to the bottom surface of the second base substrate than the top surface of the second base substrate.

4. The display device of claim 1, further comprising:
    a black matrix disposed under the second base substrate and overlapping the non-pixel area,
    wherein the first part is adjacent to the black matrix.

5. The display device of claim 4, further comprising:
    a partition wall insulation layer disposed between the light conversion layers; and
    a plurality of color filters disposed between the light conversion layers and the second base substrate,
    wherein the black matrix is disposed between the color filters.

6. The display device of claim 4, wherein a width of the first part is equal to or smaller than the width of the black matrix with respect to a direction parallel to the top surface of the second base substrate.

7. The display device of claim 4, wherein a thickness of the first part is equal to or greater than $\frac{1}{20}$ of a thickness of the second base substrate, and equal to or smaller than $\frac{1}{2}$ of the thickness of the second base substrate with respect to a direction perpendicular to the top surface of the second base substrate.

8. The display device of claim 1, wherein light generated from the pixels is reflected at a boundary surface between the first part and the second part.

9. The display device of claim 1, wherein the pixel area comprises a light emitting element configured to generate first light.

10. The display device of claim 9, wherein the light conversion layers comprise:
    a first light conversion layer configured to convert the first light into second light;
    a second light conversion layer configured to convert the first light into third light; and
    a light transmission layer configured to transmit the first light.

11. The display device of claim 10, wherein the first light includes blue light, the second light includes red light, and the third light includes green light.

12. A manufacturing method of a display device, the manufacturing method comprising:
    preparing a substrate including a base substrate, a plurality of light conversion layers disposed under the base substrate, and a black matrix disposed under the base substrate and disposed between the light conversion layers when viewed from a plane;
    emitting laser light inside the base substrate, which overlaps the black matrix, to form a first part of the base substrate; and
    bonding the substrate to a first substrate including a plurality of pixels,
    wherein a refractive index of the first part is different from the refractive index of a second part defined as the part of the base substrate around the first part.

13. The manufacturing method of claim 12, wherein the first part is disposed between a top surface and a bottom surface of the base substrate, and is located closer to the bottom surface of the base substrate than the top surface of the base substrate, and
    the bottom surface of the base substrate faces the first substrate.

14. The manufacturing method of claim 12, wherein a width of the first part is equal to or smaller than that of the black matrix with respect to a direction parallel to the top surface of the base substrate.

15. The manufacturing method of claim 12, wherein a thickness of the first part is equal to or greater than 1/20 of a thickness of the base substrate, and equal to or smaller than 1/2 of the thickness of the base substrate with respect to a direction perpendicular to the top surface of the second base substrate.

16. The manufacturing method of claim 12, wherein each of the pixels comprises:
a pixel area; and
a non-pixel area around the pixel area,
wherein the light conversion layers overlap the pixel areas of the pixels, and the black matrix overlaps the non-pixel area.

17. The manufacturing method of claim 16, wherein the first part overlaps the non-pixel area to be adjacent to the black matrix.

18. The manufacturing method of claim 16, wherein the pixel area comprises a light emitting element configured to generate first light, and the light conversion layers comprises:
a first light conversion layer configured to convert the first light into second light;
a second light conversion layer configured to convert the first light into third light; and
a light transmission layer configured to transmit the first light.

19. The manufacturing method of claim 18, wherein the substrate comprises:
a partition wall insulation layer disposed between the light conversion layers; and
a plurality of color filters disposed between the light conversion layers and the base substrate,
wherein the black matrix is disposed between the color filters.

* * * * *